United States Patent [19]

Wilkins

[11] Patent Number: 4,873,491

[45] Date of Patent: Oct. 10, 1989

[54] PHASE SHIFT CIRCUIT UTILIZING A VARIABLE TIME DELAY LINE

[76] Inventor: Jeffrey K. Wilkins, P.O. Box 4223, Stanford, Calif. 94305

[21] Appl. No.: 110,674

[22] Filed: Oct. 19, 1987

[51] Int. Cl.[4] .................. H03K 5/159; H03K 5/13
[52] U.S. Cl. ..................... 328/155; 328/55; 307/511; 307/262; 331/25
[58] Field of Search .............. 328/155, 55, 133, 134, 328/127; 307/511, 262, 597, 603, 606; 377/78; 331/1 A, 25, 17, 1 R

[56] References Cited

U.S. PATENT DOCUMENTS

| | | | |
|---|---|---|---|
| 3,436,647 | 4/1969 | Gobeli et al. | 328/155 |
| 3,624,274 | 11/1971 | Araki | 328/155 X |
| 4,169,995 | 10/1979 | Wise et al. | 307/511 X |
| 4,187,473 | 2/1980 | Cochran | 307/511 X |
| 4,309,649 | 1/1982 | Naito | 328/155 X |
| 4,626,796 | 12/1986 | Elder | 331/1 A |
| 4,694,259 | 9/1987 | Carickhoff et al. | 331/25 |
| 4,706,040 | 11/1987 | Mehrgardt | 331/25 |

OTHER PUBLICATIONS

Routledge et al., "A Phase Locked Loop Phase Shifter for Band Limited Signals", R&E Engineer, vol. 47, No. 3, Mar. 1977, pp. 117-120.

Primary Examiner—Stanley D. Miller
Assistant Examiner—Timothy P. Callahan

[57] ABSTRACT

A closed loop variable phase shift circuit utilizing a variable time delay line controlled by feedback provided by a phase detector. The circuit employs feedback control to adjust the delay of the time delay line to achieve the desired phase shift. By utilizing a variable time delay element of large dynamic range, the circuit can achieve the desired phase shift over a wide frequency range. The circuit provides an extremely accurate phase shift without need for a multitude of high precision matched components. The circuit is easily realizable in integrated circuit form. The circuit can be implemented to phase shift either analog or digital input signals. The amount of phase shift is set by an externally applied voltage.

7 Claims, 2 Drawing Sheets

PHASE SHIFT CIRCUIT UTILIZING A VARIABLE TIME DELAY LINE

BACKGROUND—FIELD OF INVENTION

This invention relates to phase shifters and in particular to phase shifters whose shifting characteristics may be controlled.

BACKGROUND—DESCRIPTION OF PRIOR ART

The prior art includes phase shifting circuits using feedback and phase shifting circuits without feedback.

1. Phase shifting circuits without the use of feedback

The phase shifting circuits which function without the use of feedback, open loop phase shifters, are normally mechanical type devices where an element of the circuit is changed mechanically to achieve the desired phase shift. These circuits have an inherent failing in that the phase shift setting is clearly dependent on frequency. Phase shift networks are implemented by a variety of means. These methods have included implemented by a variety of means. These methods have included splitting and combining circuits, saturable inductor, transformer, or impedance (including bridge impedance), designs. Such methods all involve accomplishing a phase shift by varying analog quantities, as disclosed in Prior Art Disclosure. These designs are notorious for the narrow frequency dynamic range over which they can operate. In addition, methods utilizing transformers, inductors, or impedance, require expensive bulky components. Many of these analog elements have values that are frequency dependent, further complicating design.

2. Phase shifting using feedback

The phase shifting circuits in the prior art which use feedback do not completely overcome this dependency on frequency. These circuits use a phase detector to provide feedback. These circuits use feedback only to achieve much higher accuracy than is possible with open loop phase shifters. Prior art phase control systems for voltage controlled phase shifters have employed voltage variable impedances to control the phase shift introduced by the phase shifter. Variable capacitances (varactor diodes) and resistances (varistors and field effect transistors) have both been employed. However, these prior art systems suffer from non-linearity, distortion and frequency dependence problems. Further, these designs do not guarantee that the output has the desired phase shift, and not some other phase shift with the same phase detector output. A conventional phase detector will give the same output for the desired phase shift and 360° plus the desired phase shift, 720° plus the desired phase shift, etc.

To avoid the expense, bulk, and restrictive frequency range of analog phase shifters, tapped analog and digital delay lines were developed. These devices do not control the phase shift directly, but instead must be designed to achieve a delay that approximates the phase shift desired at the frequency of interest. Digital delay lines employ high speed A/D converters to digitize the input and store it into memory. It is then shifted out of memory at a preset delay. The digital signal is then reconverted to analog form by a D/A converter. Several problems exist with this approach. Digital delay lines suffer from dynamic range limitations caused by the finite number of bits used to digitally represent the analog signal in the analog-to-digital conversion process. In addition, the delayed analog output is characterized by step noise, which is a result of the finite A/D conversion speed. Unfortunately, using faster A/D converters drastically increases system costs. Further, digital cicuitry used to control the delay produce a very noisy environment degrading signal quality.

Analog delay lines circumvent some of the limitations of digital delay lines. Analog delay lines utilize time delay elements such as charge coupled devices (CCD). CCD time delay elements function as analog shift registers and have one or more delay taps where the output signal (a delayed version of the input) can be accessed. Variable delays in this case are generated by one of two methods: (1) varying the tap selected or (2) varying the device clock rate. Unfortunately, obtaining a delay equal to a desired phase shift is difficult with either of these approaches. If the first method is chosen, the approach suffers from delay quantization error because only a finite number of delays (equal to the number of taps) are possible. If the second method is chosen, it is difficult to achieve a precisely known delay, because an equally precise clock is required. Most importantly, these designs still don't measure and control the phase shift directly, but only attempt to approximate the shift with a time delay. If either the delay is imprecisely specified or the signal input frequency is not precisely known, large errors in the phase shift induced can result.

OBJECTS AND ADVANTAGES

Accordingly, several objects and advantages of my invention are as follows: The present invention combines the time sample nature of analog and digital delay lines with phase control feedback to solve many of the problems of the prior art. By measuring the error between the desired phase shift and the actual phase shift and dynamically varying the time delay of the delay line, the present invention directly controls phase shift, not time delay, and as such provides significant advantages over tapped analog or digital delay lines. Unlike analog phase shifters, no bulky, expensive, discrete analog components are required. In addition, since the time delay of most time delay elements can be adjusted over an extremely wide dynamic range of delays, the desired phase shift can be obtained over a wide frequency range. This greatly improves the frequency dependence problems of the prior art. Finally, because the phase shift can be programmed with a simple analog voltage, processing is greatly simplified and a very large dynamic range of phase shift is obtainable. Unlike the prior art, my invention can be configured to insure that the desired phase shift is generated, and not some other phase shift with the same phase detector output.

A digital delay line version of my invention is also easily implemented. Further, the circuit can be easily redesigned to handle purely digital input signals, by changing time delay element to a digital shift register and using a digital phase detector. Further objects and advantages will become apparent from a consideration of the drawings and ensuing descriptions of it.

BRIEF DESCRIPTIONS OF THE DRAWINGS

Figure 1:
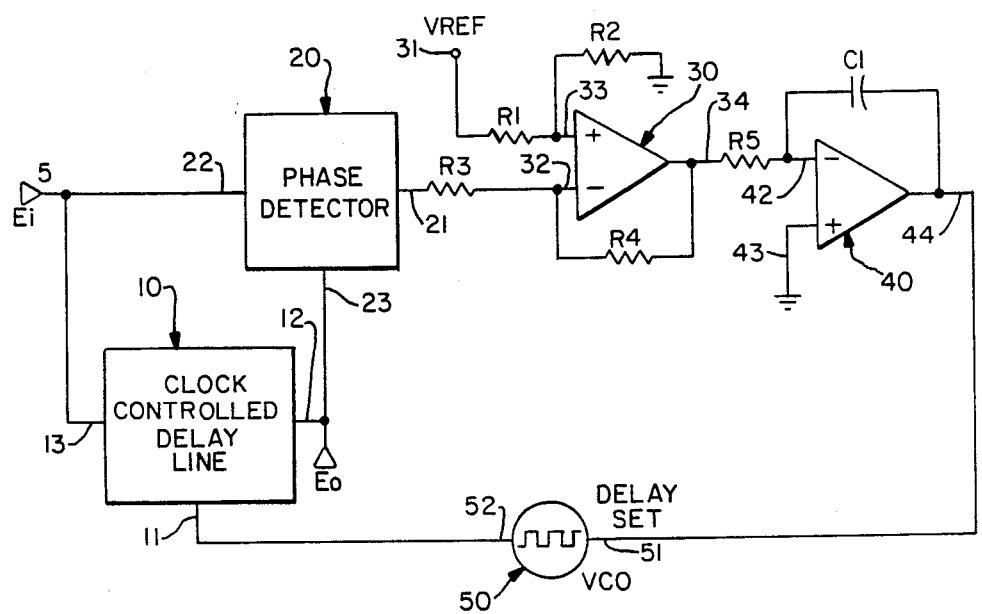
FIG. 1 is a circuit diagram of the preferred embodiment of the clock controlled phase shifter appropriate for analog input signals.

DRAWING REFERENCE NUMERALS 5 input terminal
10 clock controlled delay line
11 clock input of 10
12 output of 10
13 signal input of 10
20 analog phase detector
21 output of 20
22 reference input of 20
23 signal input of 20
30 error amplifier
31 reference voltage
32 inverting input of 30
33 noninverting input of 30
34 output of 30
40 error integrator
42 inverting input of 40
43 noninverting input of 30
44 output of 40
50 voltage controlled oscillator
51 control voltage input of 50
52 output of 50
80 switch
90 clock controlled shift register
91 clock input of 90
92 output of 90
94 data input of 90
100 digital phase detector
101 output of 100
102 reference input of 100
103 signal input of 100

DETAILED DESCRIPTION

FIG. 1 shows the principal components of my invention. The input signal to be phase shifted, Ei, is connected to the input terminal 5. The input terminal, 5, is connected to the signal input, 13, of the clock-controlled delay line, 10, and the reference input, 22, of the analog phase detector, 20. The time delay of the clock-controlled delay line, 10, is specified by the clock rate as:

*Time Delay=Number Of Buckets/Clock Rate*

The output, 12, of the clock-controlled delay line, 10, is a time-delayed version of the input. The delay line output, 12, is also the output, Eo, of the phase shift circuit. The delay line output, 12 is connected to the signal input, 23, of the analog phase detector, 20. The analog phase detector output, 21, is an analog voltage varying with the phase difference of the two inputs. The analog phase detector output, 21, is connected to the inverting input, 32, of the error amplifier, 30, by resistor R3. The error amplifier output, 34, is connected to the inverting input by resistor R4. A reference voltage, 31, is connected to the noninverting input, 33, of the error amplifier, 30, by resistor R1. Resistor R2 connects the noninverting input, 33, with electrical ground. The error amplifier output, 34, is the difference between the reference voltage, 31, and the phase detector output, 21, and is multiplied by the gain, G, of the error amplifier, 30. The gain, G, is determined by the resistor values R1, R2, R3, and R4. In practice, R2 is set equal to R4, and R1 is set equal to R3. The gain, G, is then given by R4/R3.

The error amplifier output, 34, is connected to the inverting input, 42, of the error integrator, 40. The noninverting input, 43, is connected to electrical ground. Capacitor C1 connects the inverting input, 42, and the error integrator output, 44.

The gain, G, and the integrator time constant, R5*C1, set the speed with which the clock-controlled delay lines, 10, time delay will adjust to generate the desired phase shift.

The error integrator output, 44, is connected to the voltage controlled oscillator control voltage input, 51. The voltage controller oscillator, 50, is used to control the time delay of the delay element. The VCO output, 52, is a square wave and is connected to the delay line clock input, 11. As mentioned earlier, the frequency of the VCO output, 52, sets the time delay of the clock controlled delay line, 10.

The loop will attempt to equate the reference voltage, 31, with the analog phase detector output, 21. This occurs when the clock-controlled delay element, 10, has a delay such that the induced phase shift, as measured by the phase detector output, 21, is equal to the desired phase shift specified by the reference voltage, 31. By varying the reference voltage, 31, the phase shift of Eo with respect to Ei will vary.

Figure 2:
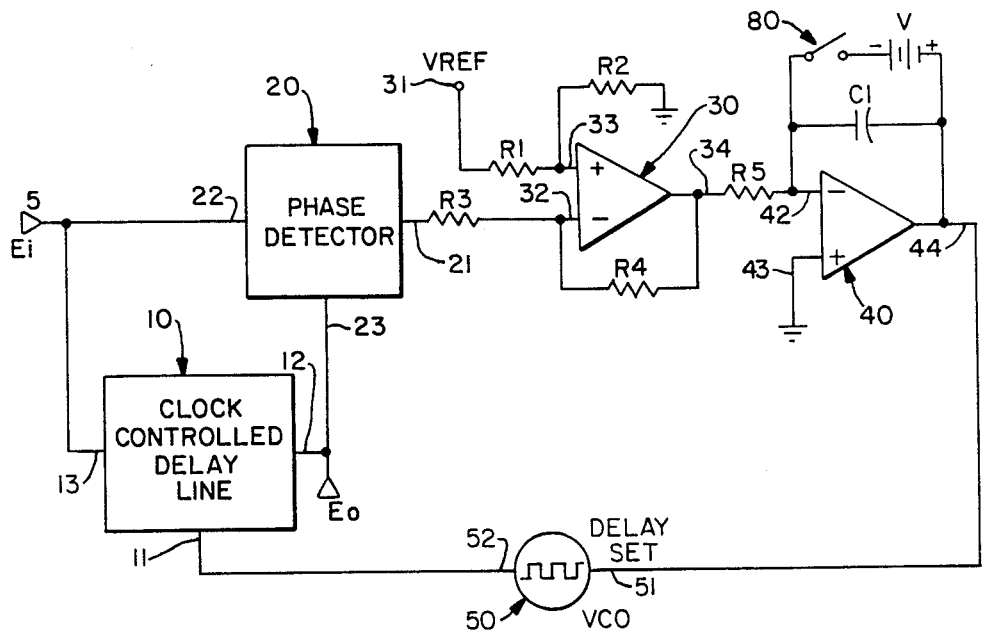
FIG. 2 is a circuit diagram of an alternative embodiment of the clock controlled phase shifter used to obtain the minimum phase shift corresponding to the applied reference voltage.

FIG. 2 is a version of the circuit that specifies the minimum phase delay, p, and not p+360°, p+720° etc. A switch, 80, is used to "start" the delay element at its minimum delay value. When the switch is closed, a voltage, V, is connected across the capacitor, C1. The error integrator output, 44, is thus equal to this voltage, V. The value of the voltage, V, is selected so that the VCO output, 52, is at the maximum frequency corresponding to minimum time delay of the clock controlled delay line, 10. Feedback control then adjusts the time delay to the minimum needed to generate the phase shift specified by the reference voltage, 31. This insures that the desired phase shift, and not some phase shift with the same phase detector output (i.e. 360° plus the desired shift, 720° plus the desired phase shift, etc.), is selected.

Figure 3:
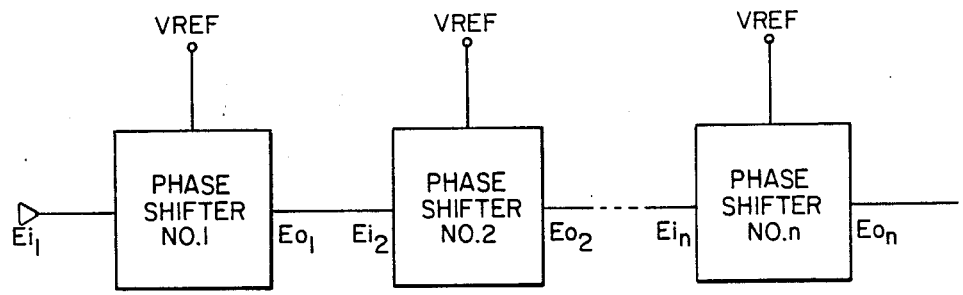
FIG. 3 shows a feedback stabilized phase shifter employing a plurality of the alternative embodiment (FIG. 2) of the clock controlled phase shifter to obtain a specified phase shift of greater than 180°.

FIG. 3 is a version of the circuit that allows phase shifts of greater than 180° to be programmed, by employing a number of the phase shifters of FIG. 2 serially connected. The phase shift programmed for each individual phase shifter is equal to the total desired phase shift divided by the number of phase shifters. The analog voltage corresponding to this phase shift is then applied to the reference voltage of all phase shifters.

Figure 4:
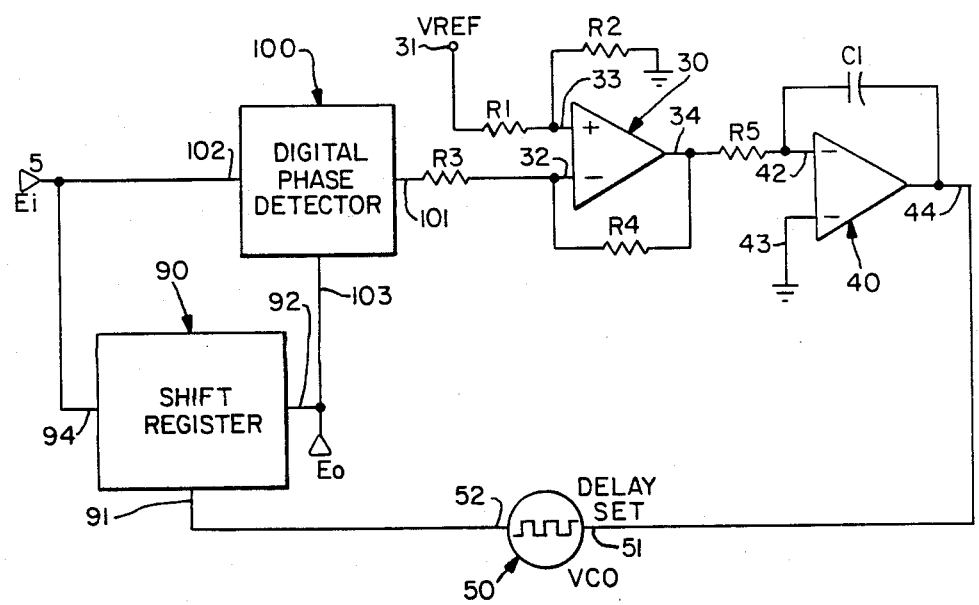
FIG. 4 is a circuit diagram showing a version of the clock controlled phase shifter appropriate for digital input signals.

FIG. 4 is an alternative embodiment of the invention suitable for digital signals. The operation of this embodiment of the invention is similar in operation to the analog version described earlier. However, in this embodiment of the invention, a clock-controlled shift register, 90, is used as the variable time delay element. The output, 92, of the clock controlled shift register, 90, is also the output, Eo, of the phase shift circuit. The voltage controlled oscillator output, 52, is connected to the clock input, 91, and is used to clock data from the data input, 94, through the clock controlled shift register, 90, at a delay specified by the clock rate and the length of the shift register. A digital phase detector, 100, is used to measure the phase shift induced by the clock controlled shift register, 90, by comparing the time delay version of the input (connected to the input signal, 103) and an undelayed version of the input (connected to the reference input, 102). The output, 101, of the digital phase detector, 100, is compared to the reference voltage, 31, to provide the feedback. The rest of the circuit is identical to that outlined in FIG. 1.

While the above description contains many specificities, the reader should not construe these as limitations on the scope of the invention, but merely as exemplifications of preferred embodiments thereof. Those skilled in the art will envision many other possible variations are within its scope. For example, skilled artisans will readily be able to employ a variety of time delay elements. They will also be able to use more than one time delay element to increase the range of possible phase shifts of the output, to include phase leads as well as phase lags. Accordingly, the reader is requested to determine the scope of the invention by the appended claims and their legal equivalents, and not by the examples which have been given.

I claim:

1. A phase modulator comprised of:
   an input signal to be phase modulated;
   a clock-controlled delay line used to provide a time delay of said input signal;
   a phase detector which measures the phase difference between said input and output of said clock-controlled delay line, output of said phase detector being a voltage that is a function of said phase difference;
   a differential operational amplifier generating an error voltage by comparing the output of said phase detector and a time-varying reference voltage;
   said time-varying reference voltage being a function of a desired amount phase modulation;
   said error voltage being applied to the input of an integrator;
   output of said integrator being a feedback control signal;
   said feedback control signal being applied to the input of a voltage-controlled oscillator;
   output of said voltage controlled oscillator being a square wave used to set said time delay of said clock-controlled delay line;
   output of said clock-controlled delay line being phase modulated from said input signal by the desired amount.

2. An analog phase shifter comprised of:
   an analog input signal to be phase shifted;
   a clock-controlled analog delay line used to provide a time delay of said analog input signal;
   a phase detector which measures the phase difference between said analog input signal and output of said clock-controlled analog delay line, output of said phase detector being a voltage that is a function of said phase difference;
   a differential operational amplifier generating an error voltage by comparing the output of said phase detector and a reference voltage representing a desired phase shift;
   said error voltage being applied to the input of an integrator;
   output of said integrator being a feedback control signal;
   said feedback control signal being applied to the input of a voltage-controlled oscillator;
   output of said voltage controlled oscillator being a square wave used to set said time delay of said clock-controlled analog delay line;
   output of said clock-controlled analog delay line being time delayed from said analog input signal to produce the desired phase shift.

3. The analog phase shifter of claim 2 comprising:
   said integrator comprised of an operational amplifier with said error voltage connected to a resistor which is connected to the inverting input of said operational amplifier;
   a capacitor connecting said inverting input and output of said operational amplifier;
   noninverting input of said operational amplifier connected to electrical ground;
   a single pole, single throw switch serially connected to a voltage source;
   said voltage source and said switch being connected in parallel with said capacitor;
   said voltage source polarity and magnitude set so as to drive said voltage controlled oscillator at maximum allowable clock rate of said clock-controlled analog delay line when said switch is closed;
   said switch being then opened allows the time delay of said clock-controlled analog delay line to increase from a minimum value to that required to generate said desired phase shift.
   wherein the smallest time delay corresponding to the desired phase shift is obtained.

4. A delay time comprising a coupled plurality of analog phase shifters coupled in series wherein each phase shifter is comprised of:
   an analog input terminal to receive an analog input signal to be phased shifted;
   a clock-controlled analog delay line used to provide a time delay of said analog input signal;
   a phase detector which measures the phase difference between said analog input signal and output of said clock-controlled analog delay line, output of said phase detector being a voltage that is a function of said phase difference;
   a differential operational amplifier generating an error voltage by comparing the output of said phase detector and a reference voltage representing a desired delay;
   said error voltage being applied to the input of an integrator;
   output of said integrator being a feedback control signal;
   said feedback control signal being applied to the input of a voltage-controlled oscillator;
   output of said voltage controlled oscillator being a square wave used to set said time delay of said clock-controlled analog delay line;
   output of said clock-controlled analog delay line being time delayed from said analog input signal by the desired delay.

5. A digital phase shifter comprised of:
   a digital input signal to be phase shifted;
   a clock-controlled shift register which delays said digital input signal;
   a phase detector which measures the phase difference between said digital input signal and output of said clock-controlled shift register, output of said phase detector being a voltage that is a function of said phase difference;

a differential operational amplifier generating an error voltage by comparing the output of said phase detector and a reference voltage representing a desired phase shift;

said error voltage connected to the input of an integrator;

output of said integrator being a feedback control signal;

said feedback control signal being applied to the input of a voltage-controlled oscillator;

output of said voltage controlled oscillator being a square wave used to set the delay of said clock-controlled shift register;

output of said clock-controlled shift register being delayed from said digital input signal by the desired phase shift.

6. The digital phase shifter of claim 5 comprising:

said integrator is comprised of an operational amplifier with said error voltage connected to a resistor which is connected to the inverting input of said operational amplifier;

a capacitor connecting said inverting input and output of said operational amplifier;

noninverting input of said operational amplifier connected to electrical ground;

a single pole, single throw switch serially connected to a voltage source;

said voltage source and said switch being connected in parallel with said capacitor;

said voltage source polarity and magnitude set so as to drive said voltage controlled oscillator at maximum allowable clock rate of said clock-controlled shift register when said switch is closed;

said switch being then opened allows the time delay of said clock-controlled shift register to increase from a minimum value to that required to generate said desired phase shift;

wherein the smallest time delay corresponding to the desired phase shift is obtained.

7. A digital delay line comprising a plurality of digital phase shifters coupled in series wherein each phase shifter is comprised of:

a digital input signal terminal receiving a digital input signal to be phase shifted;

a clock-controlled shift register which delays said digital input signal;

a phase detector which measures the phase difference between said digital input signal and output of said clock-controlled shift register, output of said phase detector being a voltage that is a function of said phase difference;

a differential operational amplifier generating an error voltage by comparing the output of said phase detector and a reference voltage representing the desired phase shift;

said error voltage connected to the input of an integrator;

output of said integrator being a feedback control signal;

said feedback control signal being applied to the input of a voltage-controlled oscillator;

output of said voltage controlled oscillator being a square wave used to set the delay of said clock-controlled shift register;

output of said clock-controlled shift register being phase shifted from said digital input signal by the desired phase shift.

* * * * *